United States Patent
Yoo

(10) Patent No.: US 11,520,489 B2
(45) Date of Patent: Dec. 6, 2022

(54) MEMORY DEVICE AND METHOD OF OPERATING THE SAME

(71) Applicant: SK hynix Inc., Gyeonggi-do (KR)

(72) Inventor: Jeong Ho Yoo, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 3 days.

(21) Appl. No.: 17/148,161

(22) Filed: Jan. 13, 2021

(65) Prior Publication Data
US 2022/0043584 A1 Feb. 10, 2022

(30) Foreign Application Priority Data
Aug. 6, 2020 (KR) .................. 10-2020-0098765

(51) Int. Cl.
*G11C 16/08* (2006.01)
*G06F 3/06* (2006.01)

(52) U.S. Cl.
CPC ............ *G06F 3/0619* (2013.01); *G06F 3/064* (2013.01); *G06F 3/0634* (2013.01); *G06F 3/0656* (2013.01)

(58) Field of Classification Search
CPC ...... G06F 3/0619; G06F 3/0634; G06F 3/064; G06F 3/0656
USPC .................................................. 365/185.22
See application file for complete search history.

(56) References Cited

U.S. PATENT DOCUMENTS

| | | | |
|---|---|---|---|
| 2016/0019975 A1* | 1/2016 | Yu ..................... | G11C 5/143 365/185.21 |
| 2016/0172049 A1* | 6/2016 | Kim ................... | G11C 8/10 365/185.12 |
| 2017/0069384 A1* | 3/2017 | Park .................. | G11C 16/32 |
| 2019/0189215 A1* | 6/2019 | Yang ................. | G11C 16/0483 |
| 2020/0027519 A1* | 1/2020 | Zhang ............... | G11C 29/021 |

FOREIGN PATENT DOCUMENTS

| KR | 10-1903580 | 10/2018 |
|---|---|---|
| KR | 10-2018-0125807 | 11/2018 |

* cited by examiner

*Primary Examiner* — Huan Hoang
*Assistant Examiner* — Minh Dinh
(74) *Attorney, Agent, or Firm* — IP & T Group LLP

(57) ABSTRACT

The present technology includes memory device and a method of operating the same. The memory device includes a memory block including a plurality of pages, a voltage generator configured to generate a program voltage or a verify voltage applied to a selected page among the plurality of pages, a page buffer connected to the selected page through bit lines and configured to perform a precharge operation, an evaluation operation, and a sensing operation on the bit lines during a verify operation, and a control circuit configured to store page addresses of slow pages of which a program operation speed for each is slower than an average program speed of the plurality of pages, and adjust an evaluation time of the evaluation operation according to the page addresses.

19 Claims, 16 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0098765, filed on Aug. 6, 2020, which is incorporated herein by reference in its entirety.

BACKGROUND

Field of Invention

The present disclosure relates to a memory device and a method of operating the same, and more particularly, to a memory device capable of performing a program operation and a method of operating the same.

Description of Related Art

A memory device may include a volatile memory device in which stored data is lost when power supply is cut off, and a non-volatile memory device in which stored data is maintained even though the power supply is cut off.

The volatile memory device may include a dynamic random-access memory (DRAM) and a static random-access memory (SRAM). The non-volatile memory device may include a read only memory (ROM), a programmable read only memory (PROM), an erasable PROM (EPROM), an electrically EPROM (EEPROM), a NAND FLASH, and the like.

The memory device may include a memory cell array, a group of circuits collectively referred to as a peripheral circuit, and a logic circuit.

The memory cell array may include a plurality of memory cells that store data. The memory cell array may be configured of any of various types of memory cells in terms of storage capacity. A single level cell (SLC) is capable of storing one bit of data, a multi level cell (MLC) is capable of storing two bits of data, a triple level cell (TLC) is capable of storing three bits of data, and a quadruple level cell (QLC) is capable of storing four bits of data.

SUMMARY

An embodiment of the present disclosure provides a memory device capable of improving reliability of a memory device by adjusting a program operation in consideration of a characteristic of slow cells and fast cells, and a method of operating the same.

A memory device according to an embodiment of the present disclosure includes a memory block including a plurality of pages, a voltage generator configured to generate a program voltage or a verify voltage applied to a selected page among the plurality of pages, a page buffer connected to the selected page through bit lines and configured to perform a precharge operation, an evaluation operation, and a sensing operation on the bit lines during a verify operation, and a control circuit configured to store page addresses of slow pages of which a program operation speed for each is slower than an average program speed of the plurality of pages, and adjust an evaluation time of the evaluation operation according to the page addresses.

A method of operating a memory device according to an embodiment of the present disclosure includes classifying each of a plurality of pages as a fast page or a slow page according to a program operation speed, and performing a verify operation for a program operation such that an evaluation operation is performed during a first evaluation time when a selected page is a fast page, and performing the verify operation such that the evaluation operation is performed during a second evaluation time shorter than the first evaluation time when the selected page is a slow page, wherein the program operation ends when the verify operation has passed, and classifying and performing are repeated until the verify operation is passes when the verify operation failed.

A method of operating a memory device according to an embodiment of the present disclosure includes classifying each of a plurality of pages as a fast page or a slow page according to a program operation speed, and performing a verify operation for a program operation such that an evaluation operation is performed during a first evaluation time when a selected page is a fast page, performing the verify operation such that the evaluation operation is performed based on the first evaluation time when the selected page is a slow page, and performing the verify operation such that the evaluation operation is performed during a second evaluation time shorter than the first evaluation time when a reference time point is reached during a program operation of a slow page, wherein the program operation ends when the verify operation has passed, and classifying and performing are repeated until the verify operation passes when the verify operation failed.

A memory device according to an embodiment of the present disclosure includes a memory cell array including a plurality of pages, and a control circuit configured to perform a program operation on a target page among the plurality of pages, determine whether the target page is a slow page or a fast page based on the result of the program operation, and perform a verify operation for the program operation based on the determination result, wherein the verify operation includes an evaluation operation performed depending on a first evaluation time when the target page is a slow page, and an evaluation operation performed depending on a second evaluation time shorter than the first evaluation time when the target page is a fast page.

The present technology may improve reliability of a memory device by controlling a program operation in consideration of a characteristic of slow cells and fast cells.

DETAILED DESCRIPTION

Throughout the specification, reference to "an embodiment," "another embodiment" or the like is not necessarily to only one embodiment, and different references to any such phrase are not necessarily to the same embodiment(s).

Figure 1:
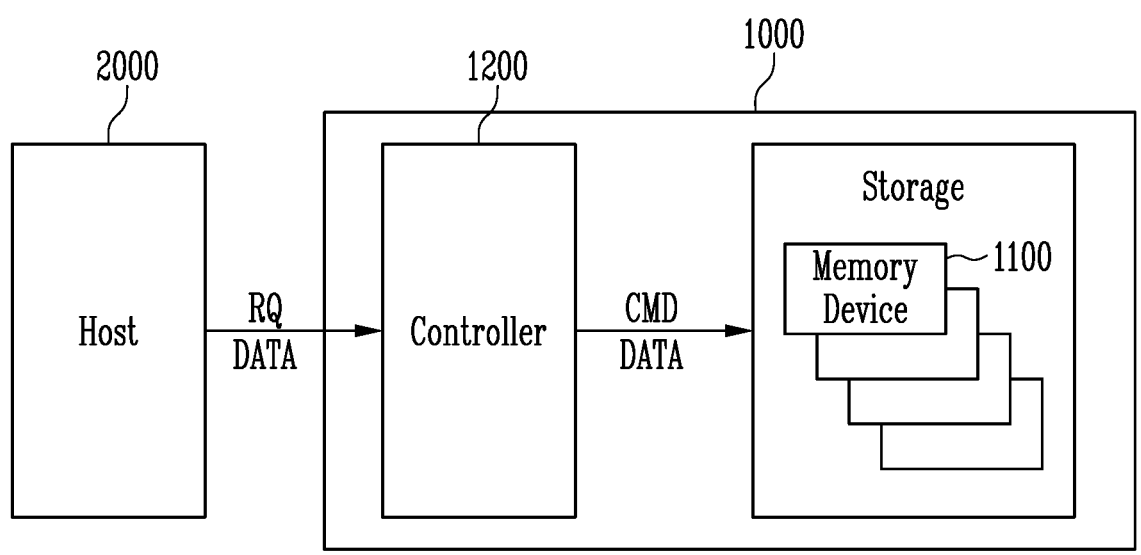
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a storage in which data is stored and a controller 1200 that controls the storage.

The storage may include a plurality of memory devices 1100, which communicate with the controller 1200 through a plurality of channels, respectively.

The controller 1200 may transmit a command CMD and data DATA to one or more memory devices 1100 through channel(s), and may also transmit an address. For example, the controller 1200 may transmit the command CMD to one or more of the memory device 1100 according to a request RQ from a host 2000. In addition, the controller 1200 may perform a background operation for improving performance of the memory system 1000 even without a request from the host 2000. The host 2000 may generate requests for various operations and may output the generated requests to the memory system 1000. For example, the host 2000 may send a request instructing the memory system 1000 to perform a program operation, a read operation, an erase operation, and the like. When the host 2000 outputs the data DATA to be programmed together with a request RQ for a program operation, the controller 1200 may transmit the data DATA to be used in the program operation together with the command CMD to the memory device 1100.

The host 2000 may communicate with the memory system 1000 through any of various interfaces such as peripheral component interconnect express (PCIe), advanced technology attachment (ATA), serial ATA (SATA), parallel ATA (PATA), serial attached SCSI (SAS), non-volatile memory express (NVMe) a universal serial bus (USB), a multi-media card (MMC), an enhanced small disk interface (ESDI), or integrated drive electronics (IDE).

Figure 2:
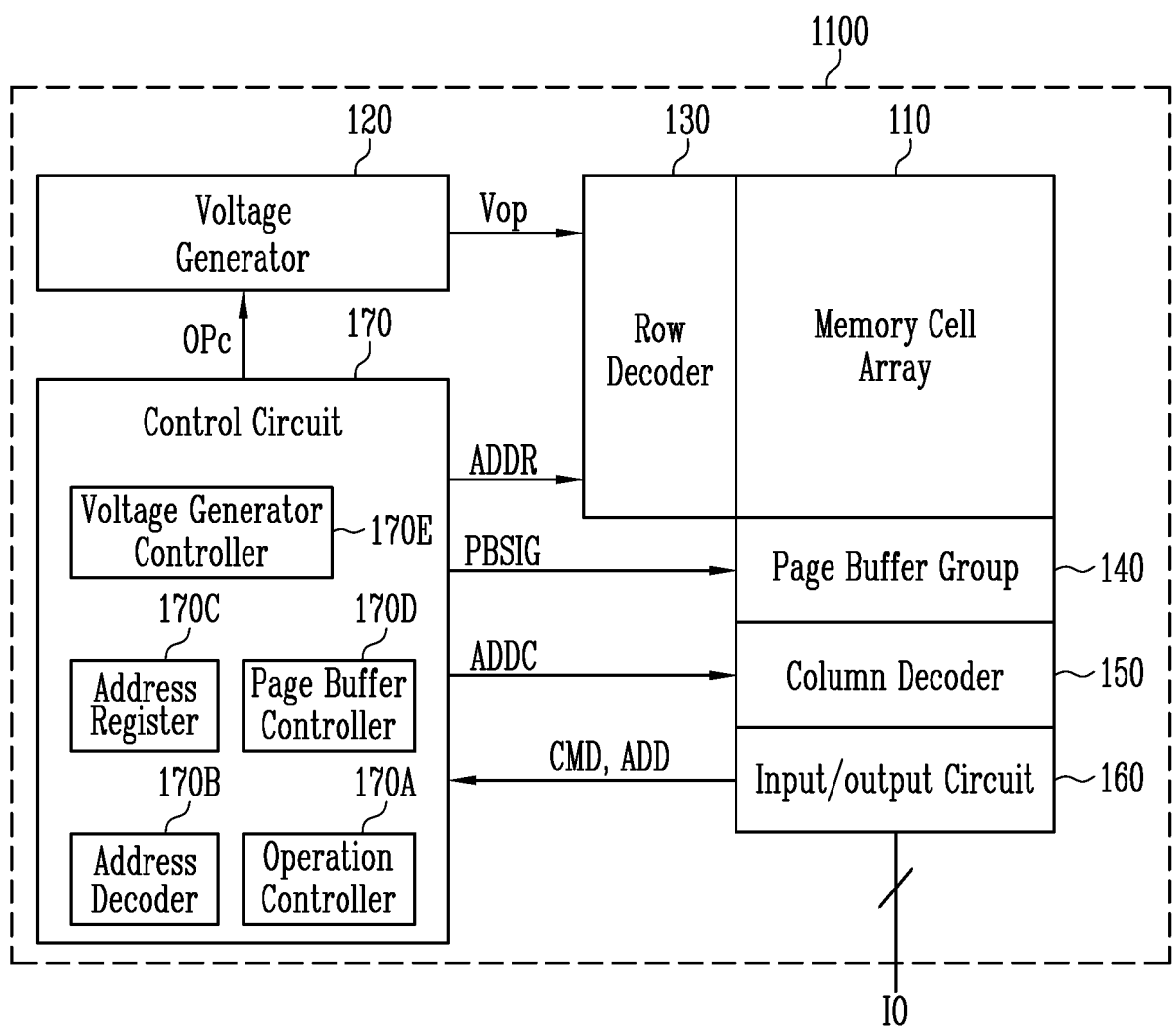
FIG. 2 is a diagram illustrating a memory device according to an embodiment of the present disclosure.

FIG. 2 is a diagram illustrating the memory device 1100 according to an embodiment of the present disclosure.

Referring to FIG. 2, the memory device 1100 may include a memory cell array 110 in which data is stored, a peripheral circuit including components 120, 130, 140, 150 and 160 for performing a program operation, a read operation, or an erase operation, and a control circuit 170 controlling the peripheral circuit.

The memory cell array 110 may include a plurality of memory blocks in which data is stored.

The peripheral circuit may include a voltage generator 120, a row decoder 130, a page buffer group 140, a column decoder 150, and an input and output (input/output) circuit 160.

The voltage generator 120 may generate and output operation voltages Vop for various operations in response to an operation code OPc. For example, the voltage generator 120 may generate and output a program voltage, a verify voltage, a read voltage, a pass voltage, and an erase voltage, change a level of the operation voltages Vop according to the operation code OPc, and change a time at which the operation voltages Vop are output. For example, during the program operation, the voltage generator 120 may output the operation voltages Vop including the program voltage and the verify voltage.

The row decoder 130 may select one of the memory blocks in the memory cell array 110 according to a row address ADDR, and may transmit the operation voltages Vop to the selected memory block.

The page buffer group 140 may be connected to the memory cell array 110 through bit lines. For example, the page buffer group 140 may include page buffers respectively connected to the bit lines. The page buffers may operate simultaneously in response to page buffer control signals PBSIG, and may temporarily store data during the program or read operation. During the verify operation, the page buffer group 140 may perform a precharge operation of precharging the bit lines to a positive voltage, an evaluation operation of changing or maintaining a potential of the bit lines according to a threshold voltage of the memory cells of a selected page, and a sensing operation of storing data in a latch according to a voltage of the bit lines.

The column decoder 150 may sequentially transmit data DATA between the input/output circuit 160 and the page buffer group 140 according to a column address ADDC.

The input/output circuit 160 may be connected to the controller 1200 (of FIG. 1) through input/output lines IO. The input/output circuit 160 may input or output a command CMD, an address ADD, and the data DATA through the input/output lines IO. For example, the input/output circuit 160 may transmit the command CMD and the address ADD received through the input/output lines IO to the control circuit 170, and may transmit the data received through the input/output lines IO to the page buffer group 140. The input/output circuit 160 may output the data received from the page buffer group 140 to the controller 1200 through the input/output lines IO.

The control circuit 170 may output the operation code OPc, the row address ADDR, the page buffer control signals PBSIG, and the column address ADDC in response to the command CMD and the address ADD. For example, the control circuit 170 may include software such as an algorithm executed according to the command CMD, and may include hardware for outputting various codes or signals according to the algorithm.

During the program operation, the control circuit 170 may adjust a time period or interval in which the verify operation is performed according to a program speed of the memory cells. To this end, the control circuit 170 may include an operation controller 170A, an address decoder 170B, an address register 170C, a page buffer controller 170D, and a voltage generator controller 170E.

The operation controller 170A may include algorithms for various operations, and may execute an algorithm selected according to the input command CMD. For example, the operation controller 170A may include an algorithm capable of executing the program operation in response to a program command. When the program command is input, the operation controller 170A may execute an algorithm capable of controlling the address decoder 170B, the address register 170C, the page buffer controller 170D, and the voltage generator controller 170E according to the input command CMD.

The address decoder 170B may decode the input address ADD and output the row address ADDR and the column address ADDC.

The address register 170C may store an address of pages or page groups of which a program speed is relatively slow. For example, during a test operation of the memory device 1100, when pages or page groups of which the program speed is relatively slow are detected, the address of the detected pages or page groups may be stored in the address register 170C.

The page buffer controller 170D may output the page buffer control signals PBSIG for controlling the page buffer group 140 under control of the operation controller 170A.

The voltage generator controller 170E may output the operation code OPc for controlling the voltage generator 120 under the control of the operation controller 170A.

During the program operation, the operation controller 170A may adjust a time period in which the evaluation operation of the verify operation is performed according to the address of the pages or page groups, which is stored in the address register 170C.

Figure 3:
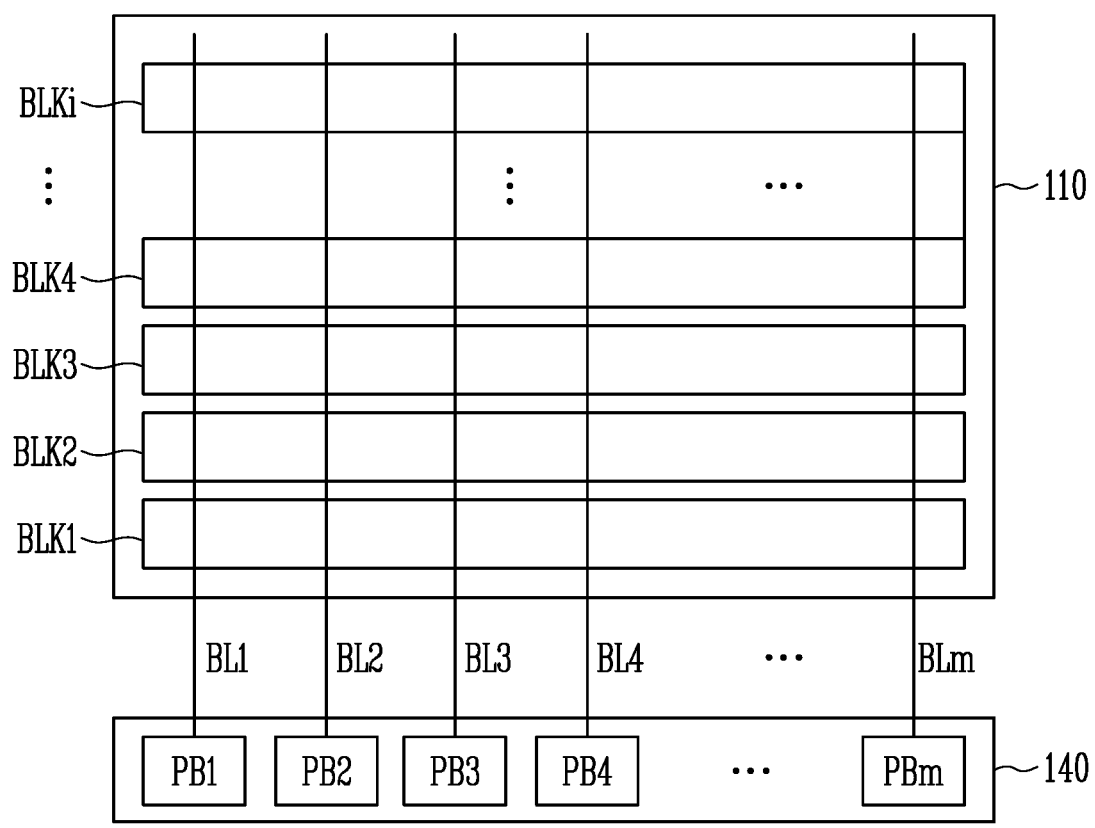
FIG. 3 is a diagram illustrating a memory cell array and a page buffer group.

FIG. 3 is a diagram illustrating the memory cell array 110 and the page buffer group 140.

Referring to FIG. 3, the memory cell array 110 may include first to i-th memory blocks BLK1 to BLKi (where i is a positive integer of 2 or greater). The first to i-th memory blocks BLK1 to BLKi may be configured identically to each other, and may be commonly connected to first to m-th bit lines BL1 to BLm.

The page buffer group 140 may include first to m-th page buffers PB1 to PBm connected to the first to m-th bit lines BL1 to BLm, respectively.

The program operation may be performed on a memory block selected from the first to i-th memory blocks BLK1 to BLKi, and the first to m-th page buffers PB1 to PBm may be connected to the selected memory block through the first to m-th bit lines BL1 to BLm, respectively.

The first to i-th memory blocks BLK1 to BLKi may be configured in a two-dimensional structure or a three-dimensional structure. A two-dimensionally configured memory block may include a plurality of memory cells arranged in a direction parallel to a substrate. A three-dimensionally configured memory block may include a plurality of memory cells stacked in a direction perpendicular to the substrate.

Embodiments may be applied to both a two-dimensionally configured memory block and a three-dimensionally configured memory block. Hereinafter, a memory block with the three-dimensional structure is described as an example. Since the first to i-th memory blocks BLK1 to BLKi are configured identically to each other, the i-th memory block BLKi is described as an example.

Figure 4:
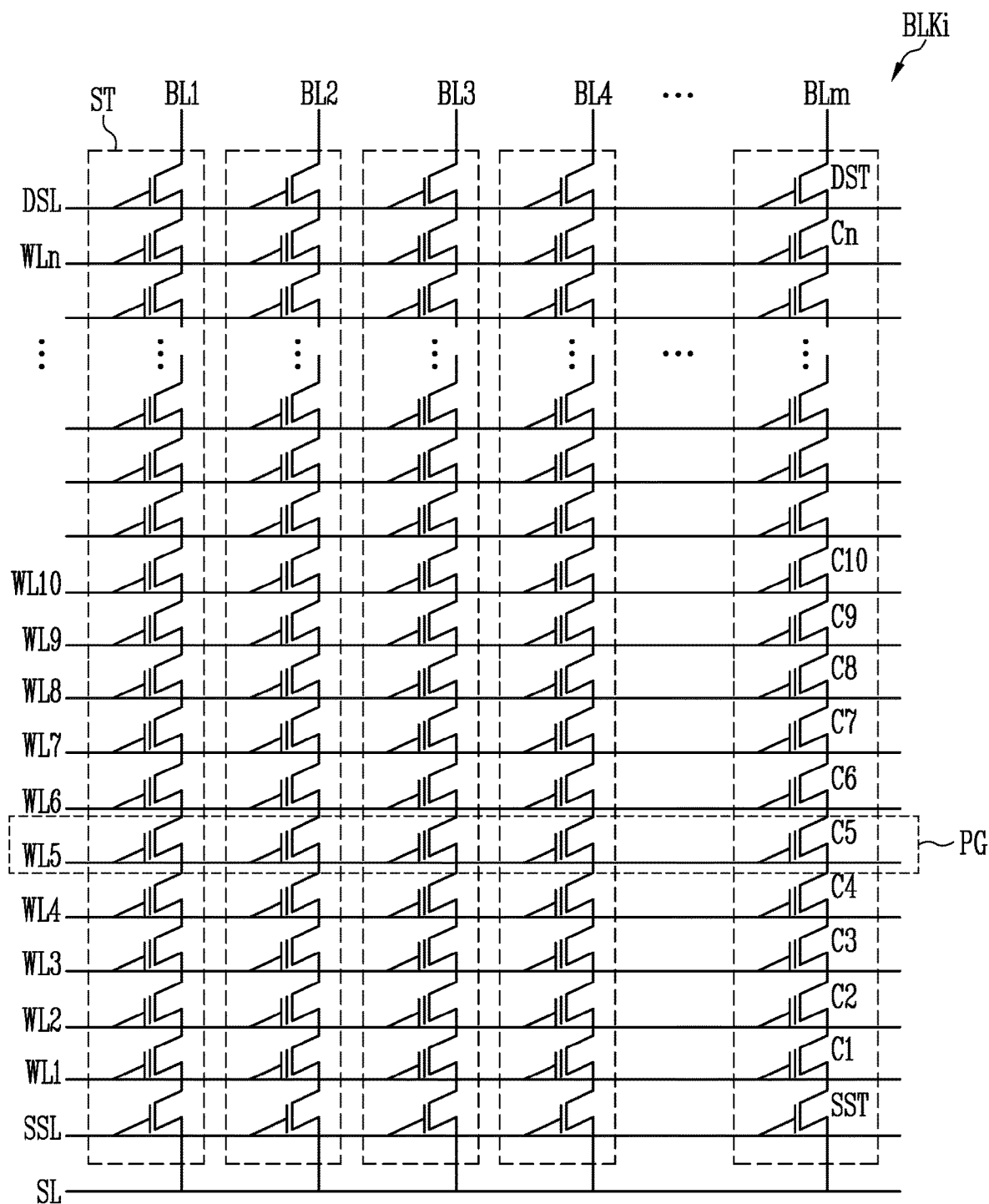
FIG. 4 is a diagram illustrating a memory block.

FIG. 4 is a diagram illustrating the representative memory block BLKi.

Referring to FIG. 4, the memory block BLKi may include a plurality of strings ST. Each of the strings ST may include a source select transistor SST, a plurality of memory cells C1 to Cn, and a drain select transistor DST. In FIG. 4, one source select transistor SST and one drain select transistor DST are shown in each of the strings ST, but more source and drain select transistors SST and DST may be included in each of the strings ST. In addition, dummy cells may be included between the plurality of memory cells C1 to Cn, and between the plurality of memory cells C1 to Cn and the source or drain select transistor SST or DST.

Each string ST is configured as described below.

The source select transistor SST may electrically connect or disconnect a source line SL and a first memory cell C1 according to a voltage applied to a source select line SSL. Gates of the first to n-th memory cells C1 to Cn may be connected to first to n-th word lines WL1 to WLn, respectively. The drain select transistor DST may electrically connect or disconnect the first to m-th bit lines BL1 to BLm and the strings ST according to a voltage applied to a drain select line DSL. The source select transistors SST may electrically connect or disconnect the strings ST and the source line SL according to the voltage applied to the source select line SSL.

A group of memory cells connected to the same word line becomes a page PG, and the program and read operations may be performed in a unit of the page PG. For example, when a page PG corresponding to a fifth word line WL5 is selected during the program operation, the program operation may be performed on the memory cells in the selected page PG. The memory cells of the selected page PG are distinguished from memory cells of unselected pages by voltages applied to the first to m-th bit lines BL1 to BLm.

Figure 5:
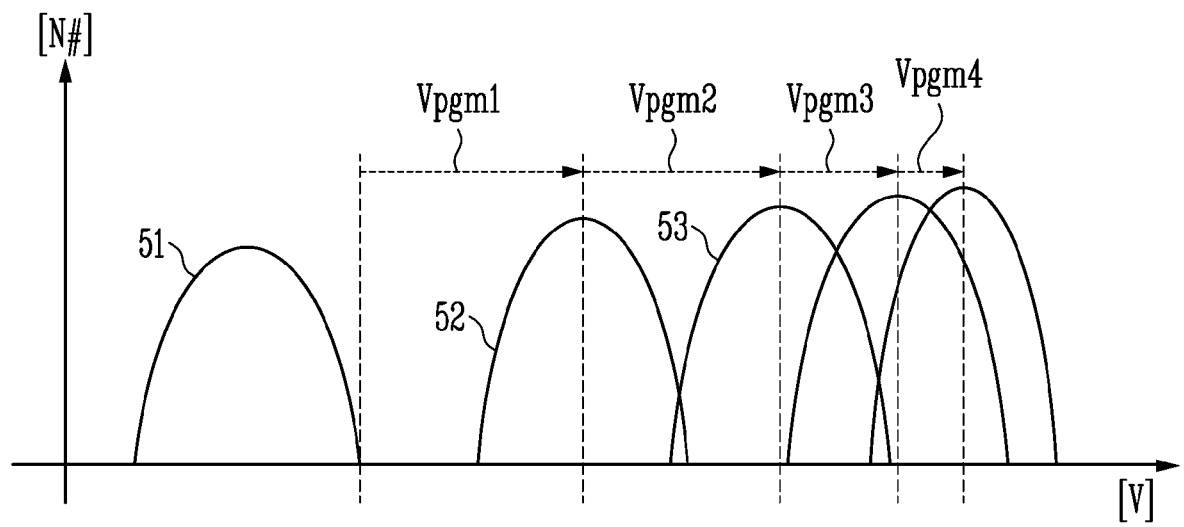
FIG. 5 is a diagram illustrating a change of a threshold voltage of memory cells by a program voltage.

FIG. 5 is a graphical diagram illustrating a change of a threshold voltage of memory cells by a program voltage.

Referring to FIG. 5, threshold voltages of the memory cells are shown. The horizontal axis of the graph represents voltage V and the vertical axis represents the number of memory cells N #. The program operation includes increasing the threshold voltage 51 of the memory cells in an erase state. For example, when a first program voltage Vpgm1 is applied to a selected word line, the threshold voltage 51 of the memory cells in the erase state may increase (52). Subsequently, when a second program voltage Vpgm2 higher than the first program voltage Vpgm1 is applied to the selected word line, the threshold voltage 52 may be increased by a set level (53). In such a method, when third and fourth program voltages Vpgm3 and Vpgm4 are sequentially applied to the selected word line, the threshold voltage of the memory cells may be gradually increased.

Since a plurality of memory cells are connected to the selected page and electrical characteristics of those memory cells may be different from each other, the threshold voltages of the memory cells to which the program voltage is applied may form a distribution. A reason why the threshold voltages of the memory cells of the selected page form such distribution is because those memory cells have different program speeds. That is, in response to the same program voltage, memory cells of which a threshold voltage change is relatively small are referred to as slow cells, and memory cells of which a threshold voltage change is relatively large are referred to as fast cells. Slow cells and fast cells are specifically described with reference to FIG. 6.

Figure 6:
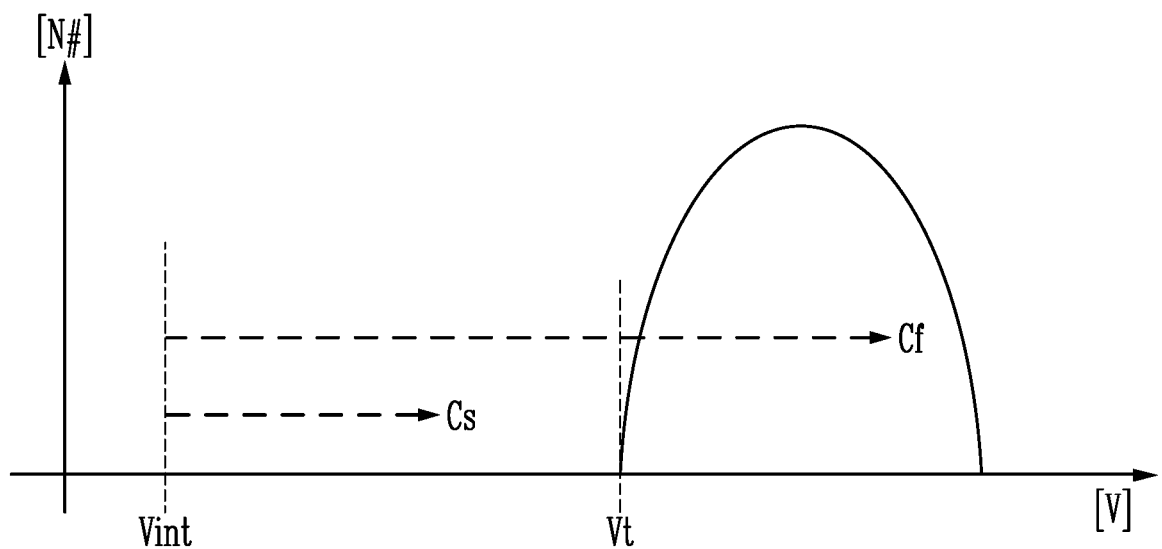
FIG. 6 is a diagram illustrating a threshold voltage change of slow cells and fast cells by the same program voltage.

FIG. 6 is a diagram illustrating threshold voltage changes of slow cells Cs and fast cells Cf by the same program voltage.

Referring to FIG. 6, slow cells Cs and fast cells Cf in the selected page have the same initial threshold voltage Vint. In this case, when the same program voltage is applied to the slow cells Cs and the fast cells Cf, threshold voltages of the fast cells Cf may be higher than a target voltage Vt, but threshold voltages of the slow cells Cs may be increased to a level lower than the target voltage Vt. In this case, the slow cells Cs are not programmed in the selected page, and thus further programming is required. Thus, the slow cells Cs may increase overall program operation time.

Figure 7:
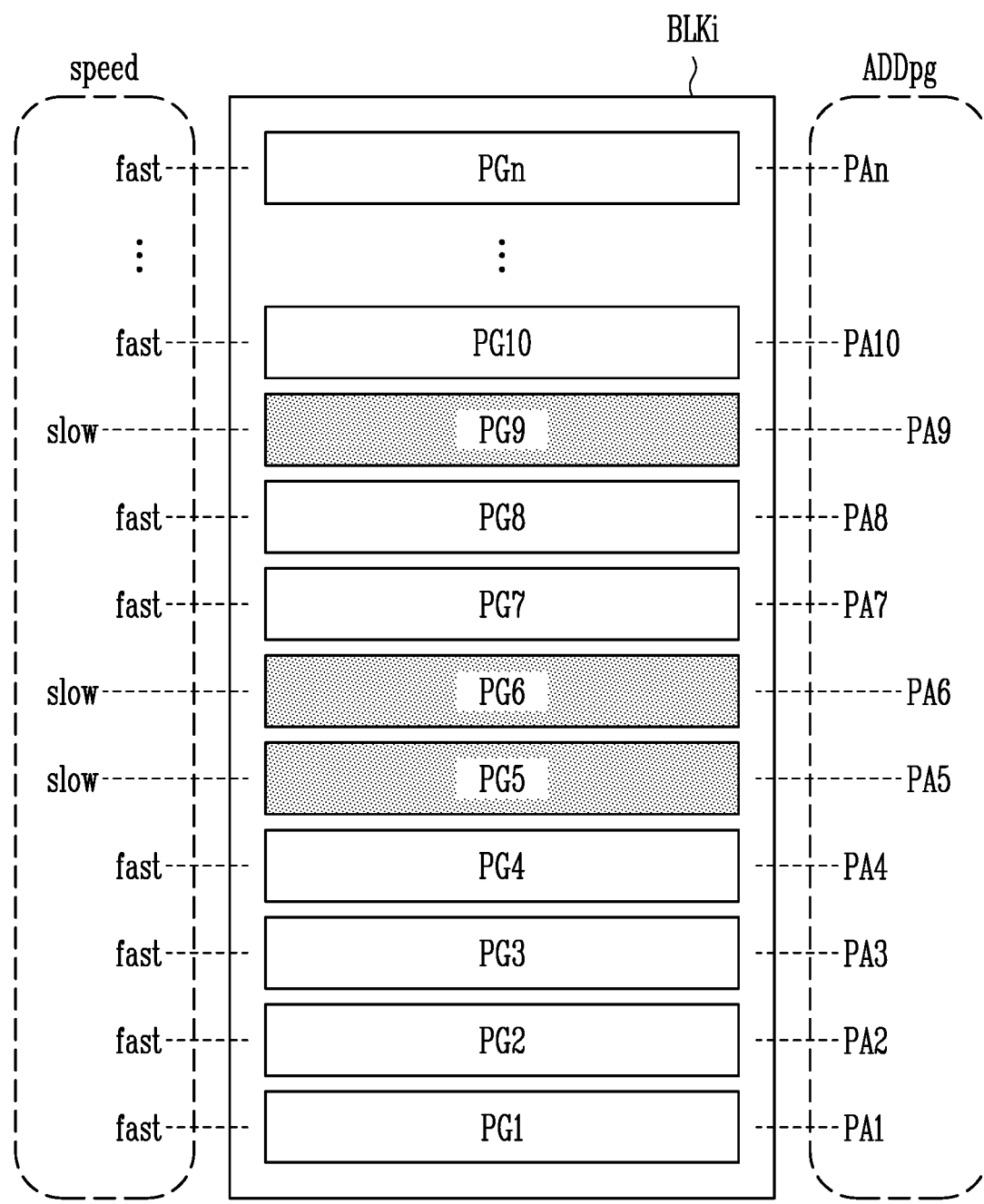
FIG. 7 is a diagram illustrating a method of classifying each of the pages of a memory block as a slow page or a fast page.

FIG. 7 is a diagram illustrating a method of classifying each of the pages of a memory block as a slow page or a fast page.

Referring to FIG. 7, when first to n-th pages PG1 to PGn are included in the i-th memory block BLKi, program operation speeds of the first to n-th pages PG1 to PGn may be different. For example, a page programmed slower than a program reference speed is considered a slow page, and a page programmed faster than the program reference speed is considered a fast page. Here, the program reference speed may be an average speed at which the plurality of pages are programmed. Since overall program operation speed is reduced by the slow pages, in an embodiment, a page address ADDpg of each of the slow pages is stored in an address register, and the program operation may be adjusted according to the stored page address ADDpg. Each of the slow pages and the fast pages may be formed by mixing a plurality of slow cells and fast cells, where each slow page has more slow cells than fast cells, and each fast page has more fast cells than slow cells.

Figure 8:
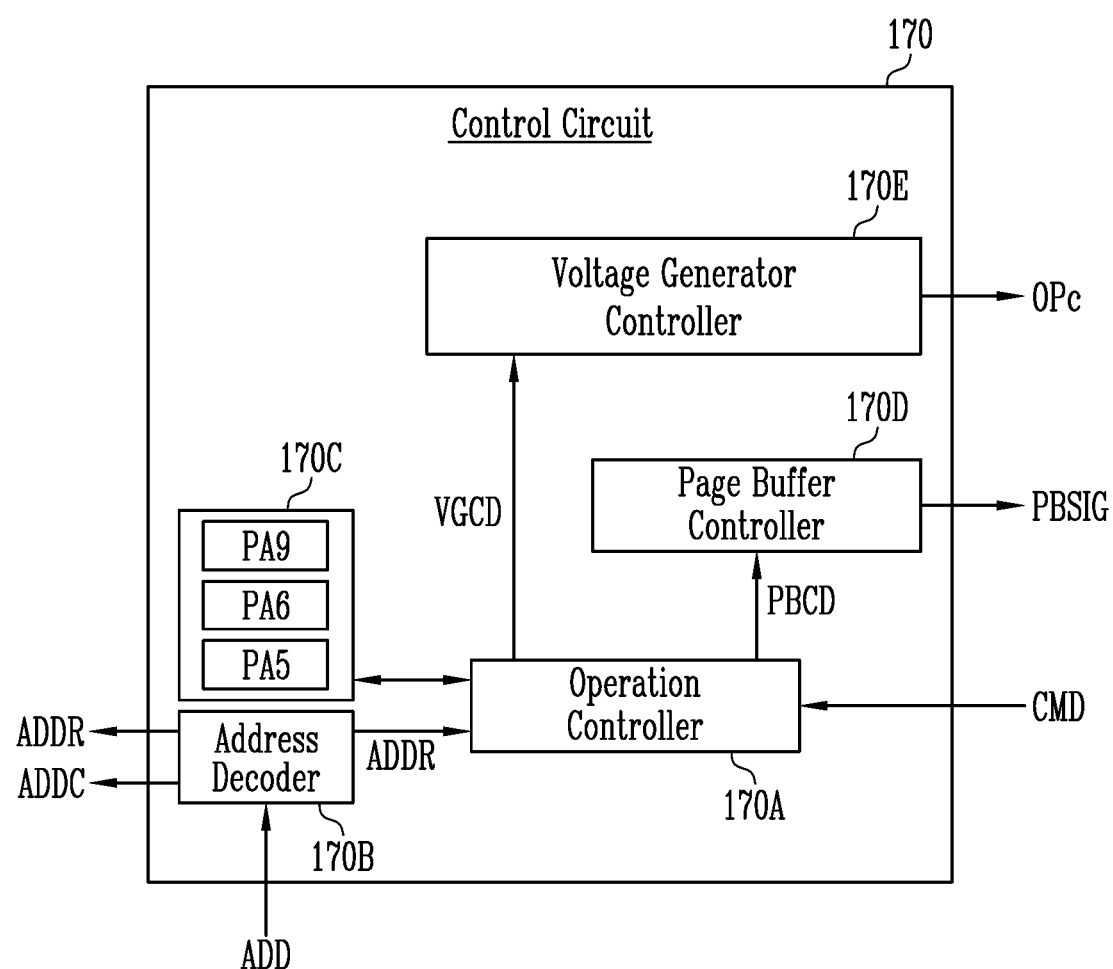
FIG. 8 is a diagram illustrating a control circuit according to an embodiment of the present disclosure.

FIG. 8 is a diagram illustrating the control circuit 170 according to an embodiment of the present disclosure.

Referring to FIG. 8, the control circuit 170 may include the operation controller 170A, the address decoder 170B, the address register 170C, the page buffer controller 170D, and the voltage generator controller 170E, as shown in FIG. 2.

When the command CMD is input, the operation controller 170A may execute an algorithm corresponding to the input command CMD. When the address ADD is input, the address decoder 170B may divide the input address ADD into the row address ADDR and the column address ADDC, and output the row address ADDR and the column address ADDC.

The operation controller 170A may receive the row address ADDR output from the address decoder 170B and compare the page address in the received row address ADDR with the page address stored in the address register 170C.

It is assumed that fifth, sixth, and ninth page addresses PA5, PA6, and PA9 corresponding to slow pages, respectively, are stored in the address register 170C, as shown in FIG. 8.

When a first page is a current program target page, the operation controller 170A may compare the page addresses stored in the address register 170C with the first page address PA1. When the comparison indicates that PA1 is not present in the address register 170C, the operation controller 170A may generate a page buffer control code PBCD and a voltage generator control code VGCD so that the verify operation in which a first evaluation time is set is performed. The page buffer controller 170D may output the page buffer control signals PBSIG in response to the page buffer control code PBCD. The voltage generator controller 170E may output the operation code OPc in response to the voltage generator control code VGCD.

When the fifth page is the current program target page, the operation controller 170A may check the address register 170C to determine whether the fifth page address PA5 is present therein. When PA5 is determined to be in the address register 170C, the operation controller 170A may generate the page buffer control code PBCD and the voltage generator control code VGCD so that the verify operation, in which a second evaluation time shorter than the first evaluation time, is set is performed. The page buffer controller 170D may output the page buffer control signals PBSIG in response to the page buffer control code PBCD. The voltage generator controller 170E may output the operation code OPc in response to the voltage generator control code VGCD.

Figure 9:
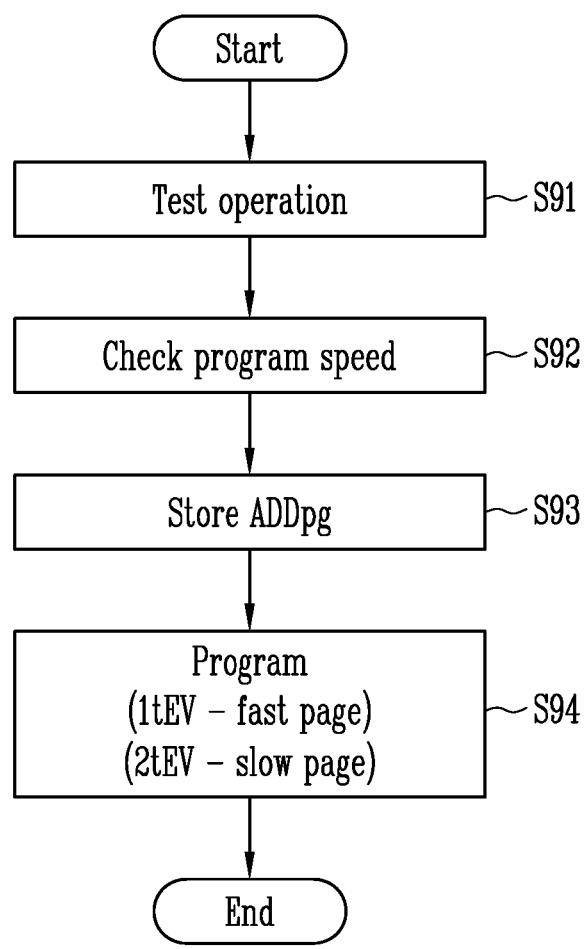
FIG. 9 is a flowchart illustrating a method of operating a memory device according to an embodiment of the present disclosure.

FIG. 9 is a flowchart illustrating a method of operating a memory device (e.g., memory device 1100 of FIGS. 1 and 2) according to an embodiment of the present disclosure.

Referring to FIG. 9, a test operation for classifying each of the pages as a fast page or a slow page may be performed (operation S91). Here, the test operation may be a test program operation. The test operation may be performed by measuring a time it takes to program the same test data in each of the pages in the selected memory block. The test operation may be performed on all memory blocks in the memory device, or may be performed on only some memory blocks.

The program speed of each page on which the test operation is performed may be checked, and based on that check, each page slower than the program reference speed may be classified as a slow page, and each page faster than the program reference speed may be classified as fast page (operation S92).

The page addresses ADDpg for the slow pages are stored in the address register 170C of FIG. 8 (operation S93). When the page addresses ADDpg for the slow pages are stored in the address register 170C, the test operation may end.

After the test operation, a normal program operation may be performed (operation S94). The normal program operation may be an operation performed at the request of a host (e.g., host 2000 of FIG. 1). The normal program operation may be sequentially performed on the pages in the selected memory block. As each page is selected, the memory device may check the page address of that page. When the selected page is a fast page, the memory device may perform the verify operation to which a first evaluation time 1tEV is applied. When the selected page is a slow page, the memory device may perform the verify operation to which a second evaluation time 2tEV shorter than the first evaluation time 1tEV is applied.

The program operation (operation S94) to which the first or second evaluation time 1tEV or 2tEV is applied is specifically described as follows.

Figure 10:
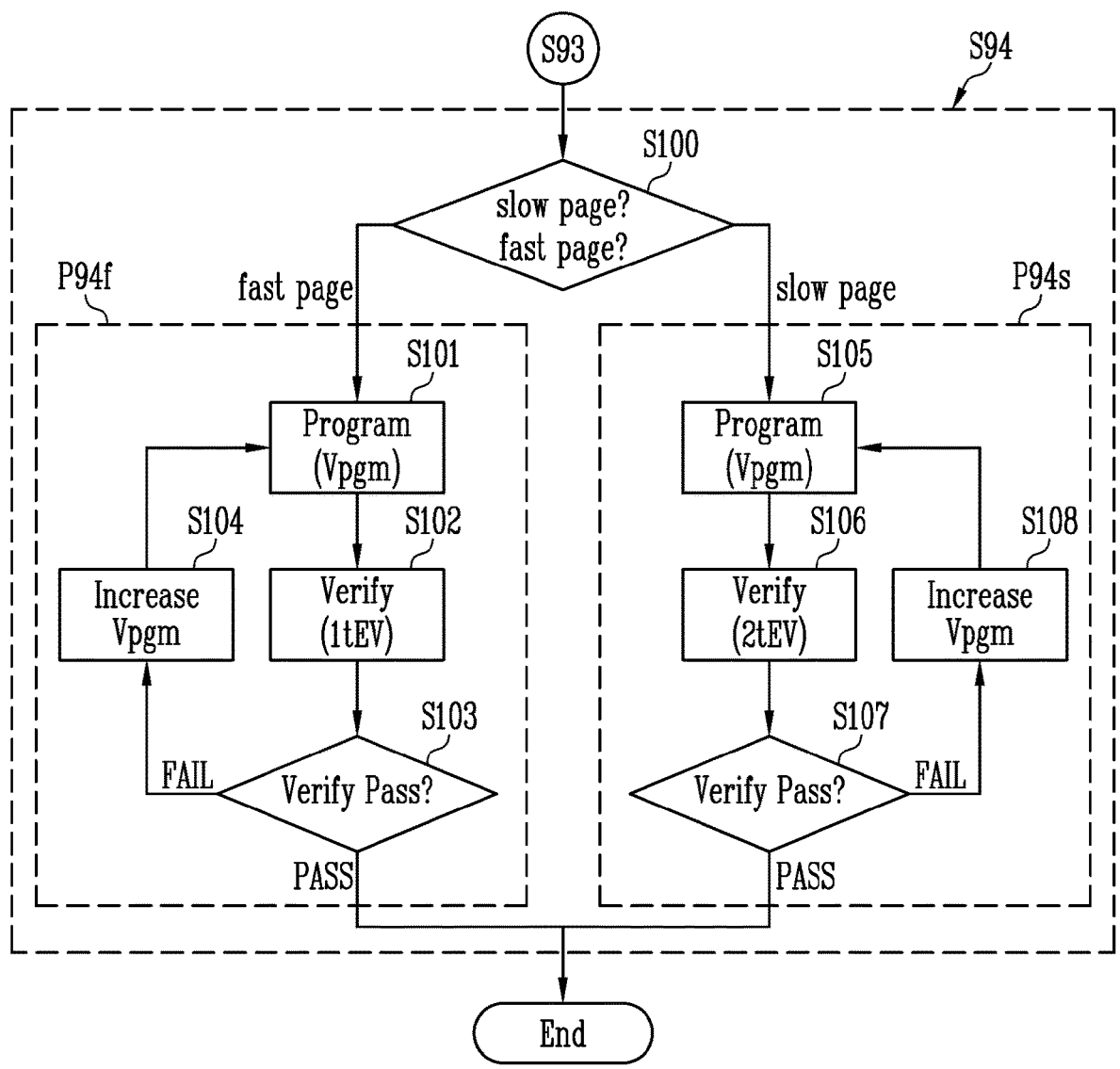
FIG. 10 is a flowchart illustrating a program operation according to an embodiment of the present disclosure.

FIG. 10 is a flowchart illustrating the program operation S94 according to an embodiment of the present disclosure.

Referring to FIG. 10, when the program operation S94 starts after operation S93, an operation of determining whether the selected page is a slow page or a fast page may be performed (operation S100). For example, the operation controller 170A of FIG. 8 may compare the address of the selected page against the page addresses stored in the address register 170C of FIG. 8 to determine whether or not the address of the selected page is stored in the address register 170C. When the address of the selected page is not included in the address register 170C, the operation controller 170A may determine that the selected page is a fast page and perform a fast page program operation P94f.

When the fast page program operation P94f is started, a program voltage application operation of applying a positive program voltage Vpgm to the selected word line may be performed (operation S101). When the program voltage Vpgm is applied to the selected word line during a set time period, the verify operation of the selected page may be performed (operation S102). The verify operation may include determining whether the threshold voltage of the memory cells in the selected page has increased to the target voltage, and may be performed by applying the verify voltage to the selected word line. The verify operation may include a precharge operation of precharging the bit lines, an evaluation operation of maintaining or changing the voltage or current of the bit lines according to the threshold voltage of the selected memory cells, and a sensing operation of sensing data in the latch of the page buffer according to the voltage or current of the bit lines. In the fast page program operation P94f, the evaluation operation may be set to be performed during the first evaluation time 1tEV.

After the verify operation (S102) is performed, the operation controller 170A may determine whether the verify operation of the selected page passed (operation S103). When it is determined that the verify operation of the selected page passed (PASS), the program operation of the selected page may end. In operation S103, when it is determined that the verify operation of the selected page failed (FAIL), the program voltage Vpgm is increased by a step voltage (operation S104), and operation 101 is performed again. Operations S101 to S104 may be repeated until the verify operation passes in operation S103.

When the address of the selected page is included in the address register 170C in operation S100, the operation controller 170A may determine that the selected page is a slow page and perform a slow page program operation P94s.

When the slow page program operation P94s is started, a program voltage application operation of applying a positive program voltage Vpgm to the selected word line may be performed (operation S105). When the program voltage Vpgm is applied to the selected word line during a set time period, the verify operation of the selected page may be performed (operation S106). The verify operation is described above in connection with operation S102, and thus is not repeated here. In the slow page program operation P94s, the evaluation operation performed in the verify operation may be set to be performed during the second evaluation time 2tEV shorter than the first evaluation time 1tEV. When the evaluation time is shortened in the verify operation, the total time of the verify operation is shortened, and thus a next program voltage may be applied to the selected page sooner than it would otherwise.

After the verify operation (S106) is performed, the operation controller 170A may determine whether the verify operation of the selected page passed (operation S107). When it is determined that the verify operation of the selected page passed (PASS), the program operation of the selected page may end. In operation S107, when it is determined that the verify operation of the selected page failed (FAIL), the program voltage Vpgm is increased by a step voltage (operation S108), and operation 105 is performed again. Operations S105 to S108 may be repeated until the verify operation passes in operation S107.

Since the memory cells in a slow page are programmed at a speed slower than that of the memory cells in a fast page, the number of program loops applied in the slow page program operation is greater than that applied to a fast page in the fast page program operation. Therefore, the number of program pulses applied to the selected word line in the slow page program operation is greater than that applied to the selected word line in a fast page in the fast page program operation. In an embodiment, during the verify operation of the program operation in which the number of program pulses may increase, such as in the slow page program operation P94s, a program operation time may be shortened by reducing a time of the evaluation operation. That is, in the slow page, a possibility that the verify operation of the memory cells failed may be increased even though the evaluation time is sufficiently given. Therefore, the total time of the program operation may be shortened by reducing the operation time so that the verify operation quickly ends and a next program pulse may be applied.

FIG. 10 shows that in the program operation of the slow page, the second evaluation time 2tEV is used in each loop, but in another embodiment the first evaluation time 1tEV may be applied in one or more loops of the slow page program operation. The program operation of the slow page to which the first evaluation time 1tEV and the second evaluation time 2tEV are selectively applied is described as follows.

Figure 11:
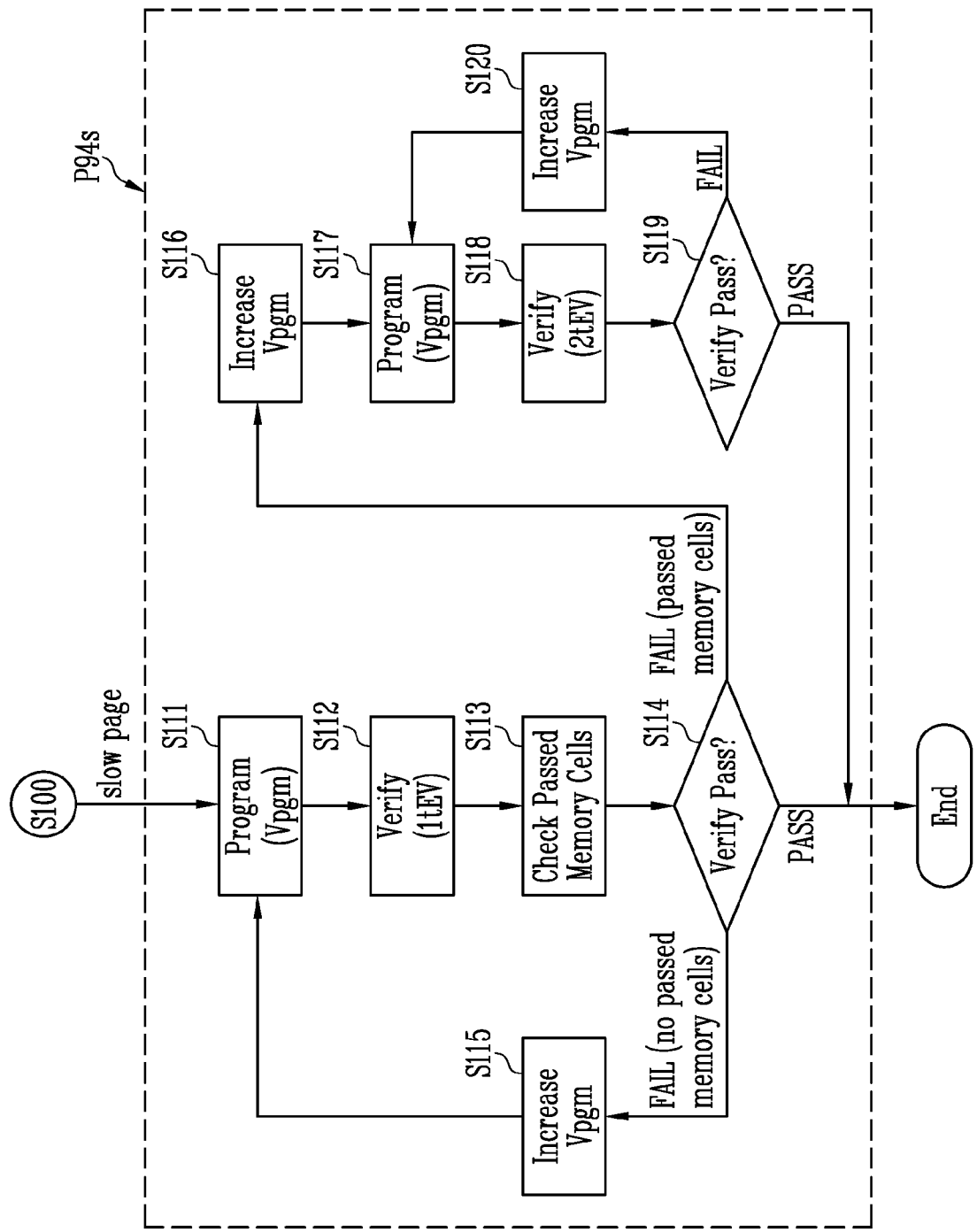
FIG. 11 is a flowchart illustrating another embodiment of a slow page program operation, such as that of FIG. 10.

FIG. 11 is a flowchart illustrating another embodiment of the slow page program operation of FIG. 10.

Referring to FIG. 11, when the slow page program operation P94s is started, a program voltage application operation of applying a positive program voltage Vpgm to the selected word line may be performed (operation S111). When the program voltage Vpgm is applied to the selected word line during a set time period, the verify operation of the selected page may be performed (operation S112). The evaluation operation performed in the verify operation may be set to be performed during the first evaluation time 1tEV. That is, the verify operation may be performed during the first evaluation time 1tEV, which occurs at the beginning of the program operation of the memory cells in the selected page.

After the verify operation (S112) is performed, the operation controller 170A may detect whether any memory cells passed (operation S113). Subsequently, the operation controller 170A may determine whether the verify operation of the selected page passed (operation S114). When it is determined that the verify operation of the selected page passed (PASS), the program operation of the selected page may end. In operation S114, when it is determined that the verify operation of the selected page failed (FAIL), the operations S115 or S116 of increasing the program voltage Vpgm by the step voltage may be performed.

When the verify operation failed such that no memory cells of which a threshold voltage is increased to the target voltage are present (FAIL; no passed memory cells), operation S115 may be performed. When the verify operation failed such that some, but not all, memory cells of which a threshold voltage is increased to the target voltage are detected (FAIL; passed memory cells), operation S116 may be performed.

When operation S115 is performed, operations S111 to S115 may be repeated until the verify operation passes (PASS) or some passed memory cells are detected in operation S114.

Since performing operation S116 means that memory cells of which the threshold voltage is increased to the target voltage are included in the selected page, the time it takes to perform the evaluation operation may be changed from the first evaluation time 1tEV to the second evaluation time 2tEV.

When the program voltage Vpgm is set high in operation S116, the program voltage application operation of applying the positive program voltage Vpgm to the selected word line may be performed (operation S117). When the program voltage Vpgm is applied to the selected word line during a set time period, the verify operation of the selected page may be performed (operation S118). The evaluation operation performed in the verify operation S118 may be set to be performed during the second evaluation time 2tEV shorter than the first evaluation time 1tEV. When the evaluation time is shortened in the verify operation, the total time of the verify operation is shortened, and thus the time for applying the next program voltage to the selected page may be advanced.

After the verify operation (S118) is performed, the operation controller 170A may determine whether the verify operation of the selected page passed (operation S119). When it is determined that the verify operation of the selected page passed (PASS), the program operation of the selected page may end. In operation S119, when it is determined that the verify operation of the selected page failed (FAIL), the program voltage Vpgm is increased by the step voltage (operation S120), and operation S117 is performed again. Operations S117 to S120 may be repeated until the verify operation passes in operation S119 (PASS).

The verify operation, which is one of the above-described operations, is performed as described below.

Figure 12:
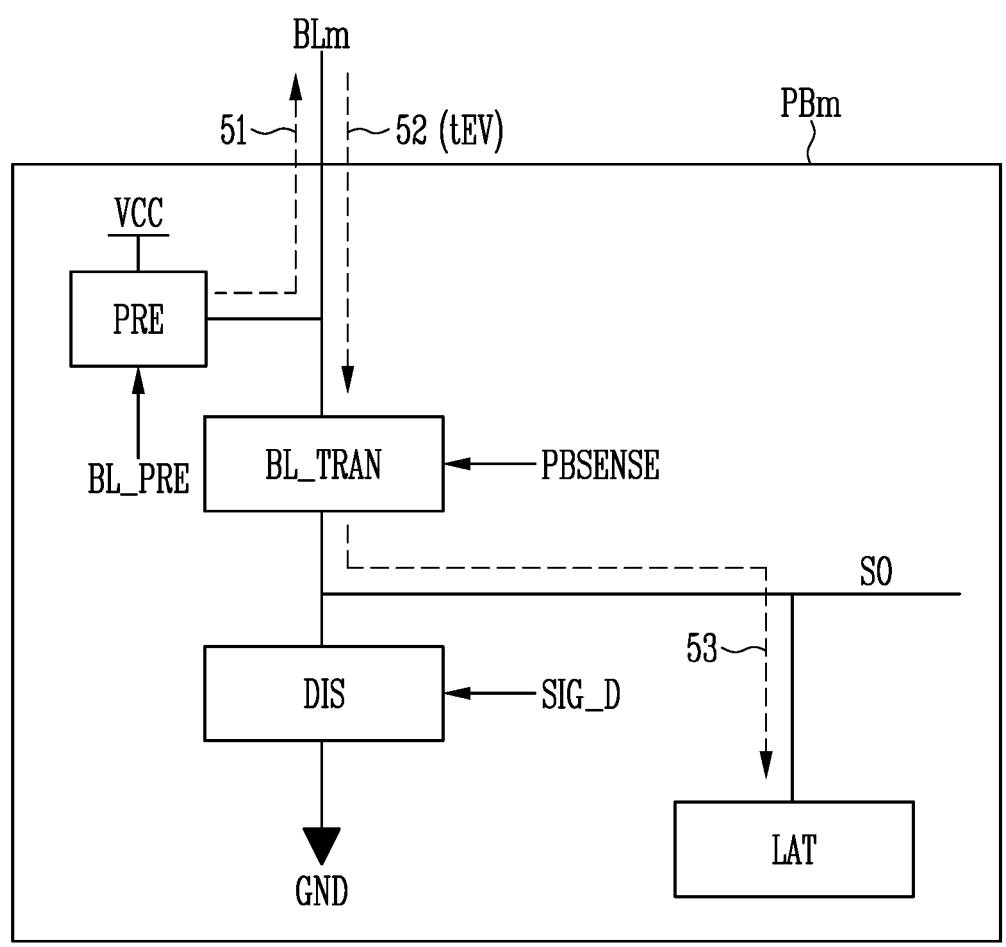
FIG. 12 is a diagram illustrating an operation sequence of a page buffer during a verify operation.
Figure 13:
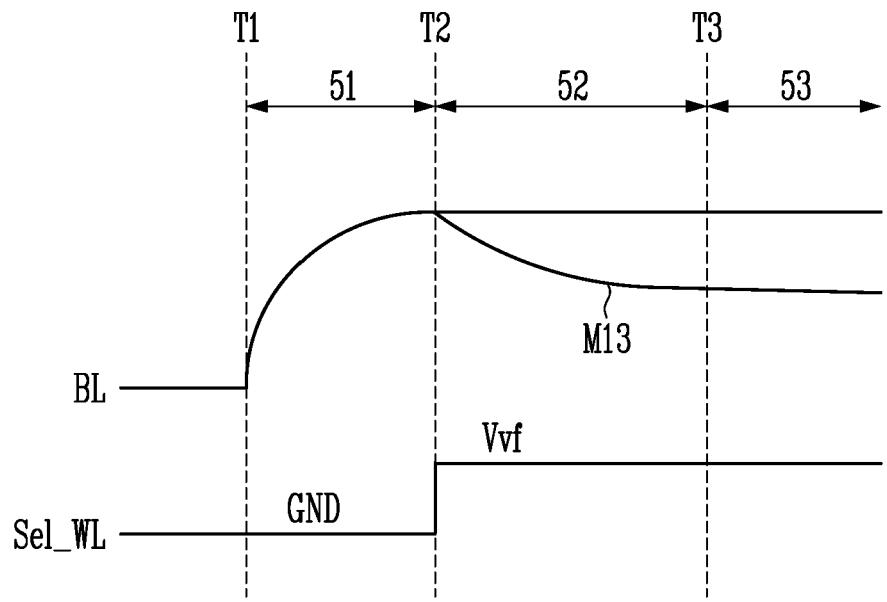
FIG. 13 is a diagram illustrating an evaluation operation during a verify operation.

FIG. 12 is a diagram illustrating an operation sequence of a page buffer during a verify operation. FIG. 13 is a diagram illustrating an evaluation operation during the verify operation.

Referring to FIGS. 12 and 13, the verify operation may include a precharge operation 51 of precharging a bit line, an evaluation operation 52 of changing or maintaining a potential of the bit line according to the threshold voltage of the memory cells of the selected page, and a sensing operation 53 of storing data in a latch according to a voltage of the bit line. Since the above-described precharge operation 51, evaluation operation 52, and sensing operation 53 are performed in each page buffer, the m-th page buffer PBm is described as an example as follows.

The m-th page buffer PBm may include a precharge circuit PRE, a bit line transmission circuit BL_TRAN, a discharge circuit DIS, and a latch LAT. The m-th page buffer PBm typically includes various other circuits in addition to the circuits shown in FIG. 12, but only circuits pertaining to the operations described in connection with FIG. 12 are shown therein.

The precharge circuit PRE may precharge the m-th bit line BLm to a positive voltage by transferring a power voltage VCC to the m-th bit line BLm in response to a bit line precharge signal BL_PRE (i.e., a period from T1 to T2 of FIG. 13). At this time, a ground voltage GND may be applied to a selected word line Sel_WL.

When the m-th bit line BLm is precharged (i.e., time T2 of FIG. 13), a verify voltage Vvf may be applied to the selected word line Sel_WL, and the evaluation operation 52 may be performed. The evaluation time tEV during which the evaluation operation 52 is performed may be set to occur during which the threshold voltage of the memory cell may be reflected on the m-th bit line BLm. For example, since a memory cell M13 having a threshold voltage lower than the verify voltage is turned on by the verify voltage, a voltage of the precharged m-th bit line BLm may be reduced.

The bit line transmission circuit BL_TRAN may connect the m-th bit line BLm and a sensing node SO to each other in response to a page sensing signal PBSENSE. For example, when the evaluation operation 52 is performed during an evaluation time tEV (i.e., the time T3 of FIG. 13), the bit line transmission circuit BL_TRAN may be activated, and thus the sensing operation 53 in which the voltage or current of the m-th bit line BLm is transmitted to the latch LAT through the sensing node SO may be performed. That is, the evaluation time tEV may be adjusted to occur when the bit line transmission circuit BL_TRAN is activated.

The discharge circuit DIS may discharge the sensing node SO in response to a discharge signal SIG_D, and may be used when the sensing node SO is initialized or data is transmitted between a plurality of latches.

Figure 14:
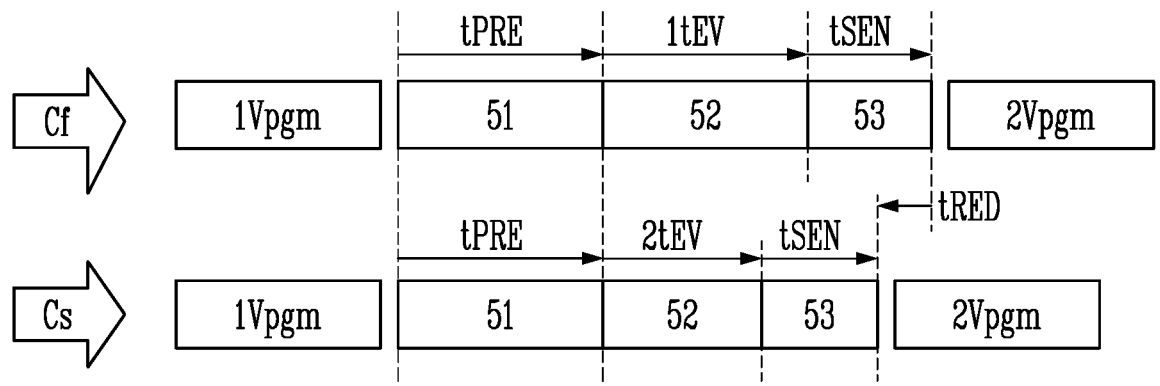
FIG. 14 is a diagram illustrating a program operation of a slow cell and a fast cell according to an embodiment of the present disclosure.

FIG. 14 is a diagram illustrating program operations of a slow cell Cs and a fast cell Cf according to an embodiment of the present disclosure.

Referring to FIG. 14, when programming the slow cell Cs and the fast cell Cf so that the threshold voltages of the slow cell Cs and the fast cell Cf are increased to the same target voltage, the evaluation operation of the fast cell Cf may be set to be performed during the first evaluation time 1tEV, and the evaluation operation of the slow cell Cs may be set to be performed during the second evaluation time 2tEV shorter than the first evaluation time 1tEV.

The total time it takes to perform the verify operation may include a time tPRE to perform the precharge operation 51, a time 1tEV or 2tEV to perform the evaluation operation 52, and a time tSEN to perform the sensing operation 53. For example, after a first program voltage 1Vpgm is applied to the selected word line, the precharge operation 51 may be performed. The precharge operation 51 may be performed in the fast cell Cf and the slow cell Cs during the same time period tPRE.

The time to perform the evaluation operation 52 of the slow cell Cs may be set to a time 2tEV shorter than the time 1tEV to perform the evaluation operation 52 of the fast cell Cf. Since the slow cell Cs is programmed at a speed slower than that of the fast cell Cf, more program pulses may be used than the fast cell Cf. Therefore, the verify time may be shortened by tRED compared to the fast cell Cf by shortening the time for performing the evaluation operation of the slow cell Cs to the second evaluation time 2tEV. Accordingly, the time at which a next program voltage 2Vpgm is applied may be advanced, and thus the total program operation time of the slow cell Cs may be shortened.

Figure 15:
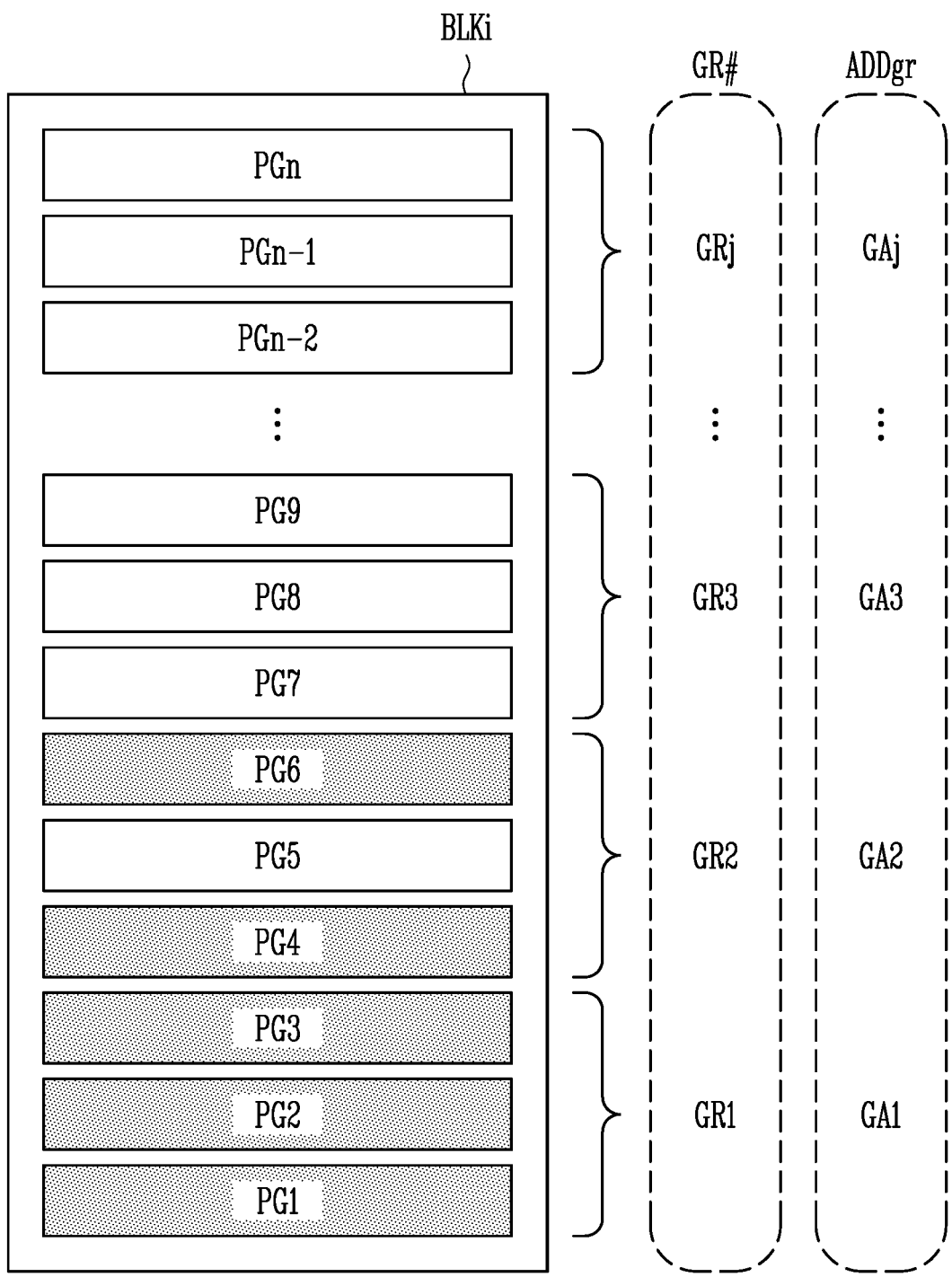
FIG. 15 is a diagram illustrating a method of classifying pages of a memory block as part of a slow group or part of a fast group.

FIG. 15 is a diagram illustrating a method of classifying some of the pages PG1 to PGn of a memory block BLKi into one or more slow groups and other pages into one or more fast groups.

Referring to FIG. 15, the pages PG1 to PGn of the i-th memory block BLKi may be classified into a plurality of page groups, and a group address ADDgr may be set in each of the page groups. For example, first to third pages PG1 to PG3 may be set as a first page group GR1, and a first group address GA1 may be assigned to the first page group GR1. Fourth to sixth pages PG4 to PG6 may be set as a second page group GR2, and a second group address GA2 may be assigned to the second page group GR2. Seventh to ninth pages PG7 to PG9 may be set as a third page group GR3, and a third group address GA3 may be assigned to the third page group GR3. In such a method, (n-2)th to n-th pages PG(n-2) to PGn may be classified into a j-th page group GRj, and a j-th group address GAj may be set to the j-th page group GRj.

When the first to third pages PG1 to PG3 are detected as slow pages as a result of the test operation (i.e., operation S91 of FIG. 9), the first page group GR1 including the first to third pages PG1 to PG3 may be set as a slow group. When one or more pages among the pages in the page group are detected as slow page(s), the corresponding page group may also be set as a slow group. For example, when the fourth and sixth pages PG4 and PG6 are detected as slow pages and the fifth page PG5 is detected as a fast page, the second page group GR2 including the fourth and sixth pages PG4 and PG6 may be set as a slow group. Various criteria may be used for setting a page group as a slow group consistent with the teachings herein. Which criterion is used in a particular instance depends on characteristics of the memory device.

Figure 16:
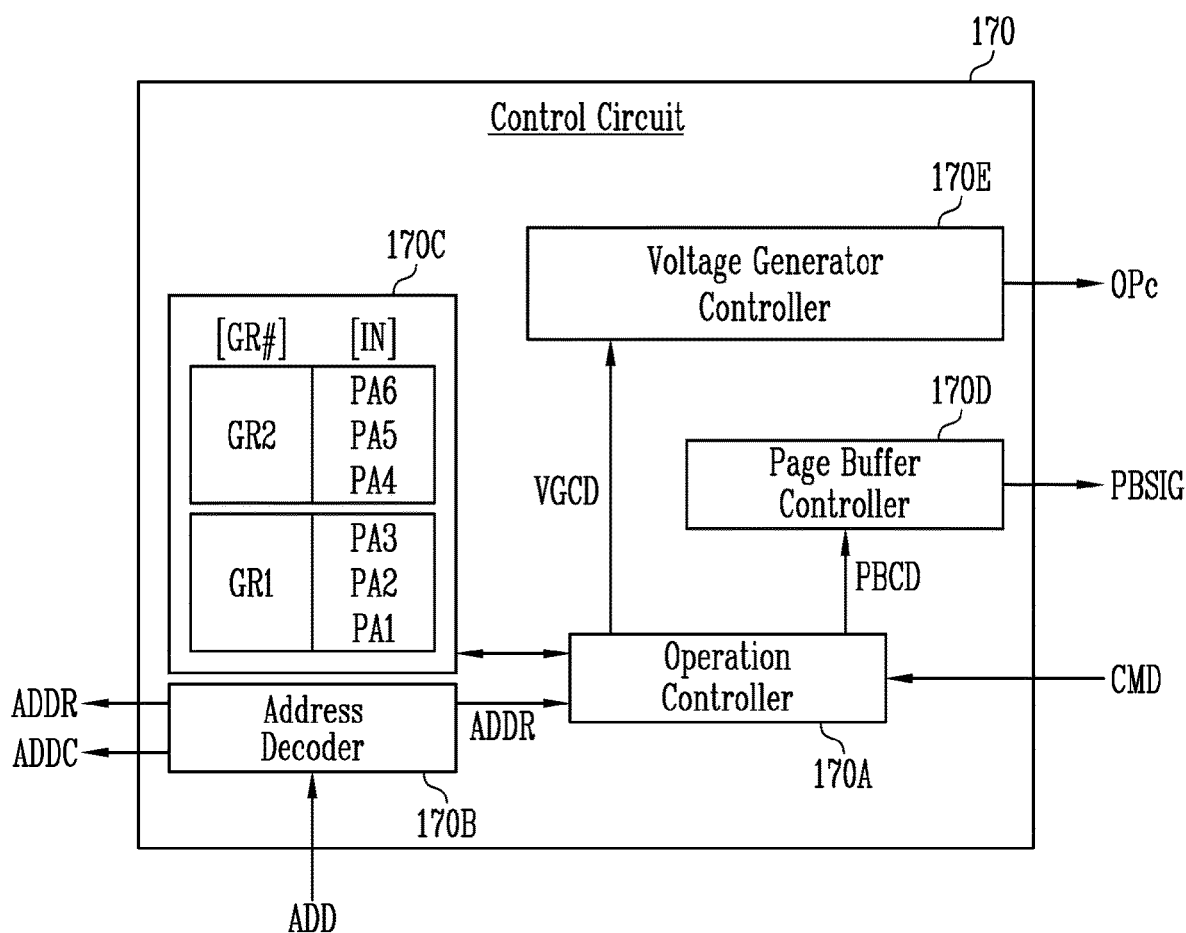
FIG. 16 is a diagram illustrating a control circuit according to an embodiment of the present disclosure.

FIG. 16 is a diagram illustrating a control circuit 170 according to an embodiment of the present disclosure.

Referring to FIG. 16, the control circuit 170 may include the operation controller 170A, the address decoder 170B, the address register 170C, the page buffer controller 170D, and the voltage generator controller 170E.

When the command CMD is input, the operation controller 170A may execute an algorithm corresponding to the input command CMD. When the address ADD is input, the address decoder 170B divides the input address ADD into the row address ADDR and the column address ADDC, and output the row address ADDR and the column address ADDC.

The operation controller 170A may receive the row address ADDR output from the address decoder 170B and compare the page address in the received row address ADDR with an index IN of the address register 170C.

The address register 170C may include a table including group(s) GR # and an index IN field in which indices of pages of the groups are identified in association with the corresponding group GR #. GR # may identify slow page group(s), and indices of pages in the slow group(s) may be identified in the IN field. For example, when the first and second page groups GR1 and GR2 are slow page groups, the index IN may include all page addresses PA1 to PA6 in first and second page groups GR1 and GR2. That is, all pages of a slow group including fast pages are identified in the IN field. For example, as shown in FIG. 15, the fifth page PG5 is a fast page, but the second page group GR2 including the fifth page PG5 is a slow page group; thus, the fifth page address PA5 corresponding to the fifth page PG5 may be included in the index IN of the address register 170C.

When the seventh page PG7 is a current program target page, the operation controller 170A may compare the page addresses stored in the address register 170C with the seventh page address PA7. When the comparison reveals that PG7 is not present in the address register 170C, the operation controller 170A may generate a page buffer control code PBCD and a voltage generator control code VGCD so that the verify operation in which a first evaluation time is set is performed. The page buffer controller 170D may output the page buffer control signals PBSIG in response to the page buffer control code PBCD, and the voltage generator controller 170E may output the operation code OPc in response to the voltage generator control code VGCD.

When the second page PG2 is a current program target page, the operation controller 170A may compare the page addresses stored in the address register 170C with the second page address PA2. When the comparison reveals that PG2 is present in the address register 170C, the operation controller 170A may generate the page buffer control code PBCD and the voltage generator control code VGCD so that the verify operation in which a second evaluation time shorter than the first evaluation time is set is performed. The page buffer controller 170D may output the page buffer control signals PBSIG in response to the page buffer control code PBCD, and the voltage generator controller 170E may output the operation code OPc in response to the voltage generator control code VGCD.

Figure 17:
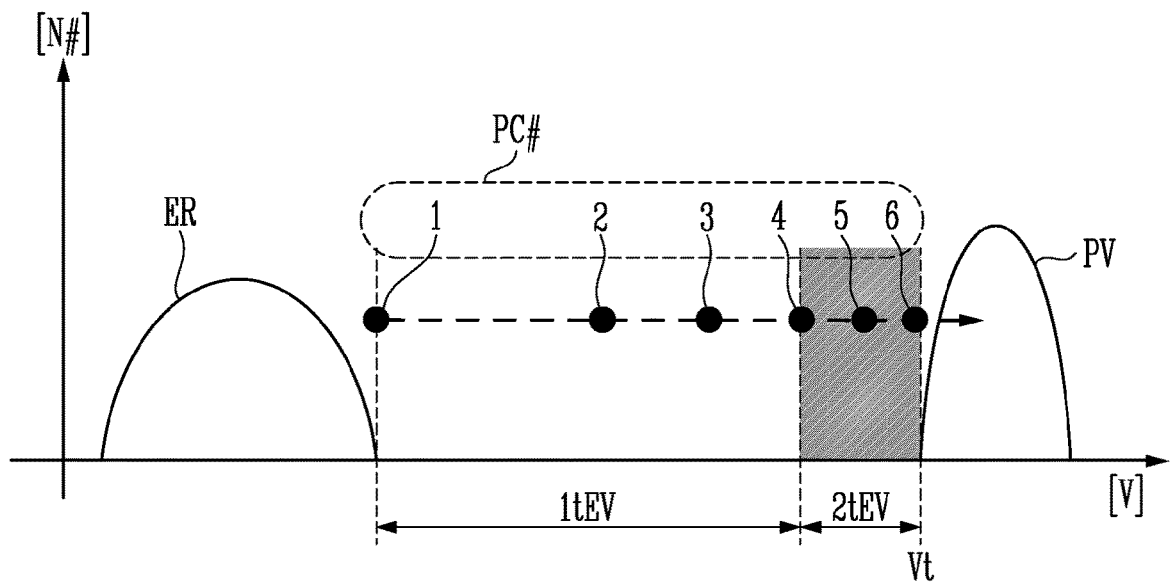
FIG. 17 is a diagram illustrating an embodiment in which a time in which an evaluation operation is performed is adjusted according to the number of program pulses.

FIG. 17 is a diagram illustrating an embodiment in which the time of an evaluation operation is adjusted according to the number of program pulses.

Referring to FIG. 17, when the slow cells in the erase state ER are programmed to the target state PV, the program operation may be performed using an incremental step pulse program (ISPP) method in which the program voltage is gradually increased. In the program operation performed by the ISPP method, the operation in which the program voltage is applied and the verify operation may form one loop. Therefore, as the number of loops increases, the number of program pulses applied to the selected word line increases.

In the illustrated embodiment of FIG. 17, the evaluation time may be adjusted according to the number of program pulses PC #. For example, the verify operation to which the first evaluation time 1tEV is applied may be performed at the beginning of programming the memory cells of the erase state ER, and the verify operation to which the second evaluation time 2tEV shorter than the first evaluation time 1tEV is applied may be performed in a period in which the threshold voltage is close to the target voltage Vt.

For example, the verify operation to which the first evaluation time 1tEV is applied may be performed when the number of program pulses PC # is 1 to 3, and the verify operation to which the second evaluation time 2tEV is applied may be performed when the number of program pulses PC # is 4 or more.

Figure 18:
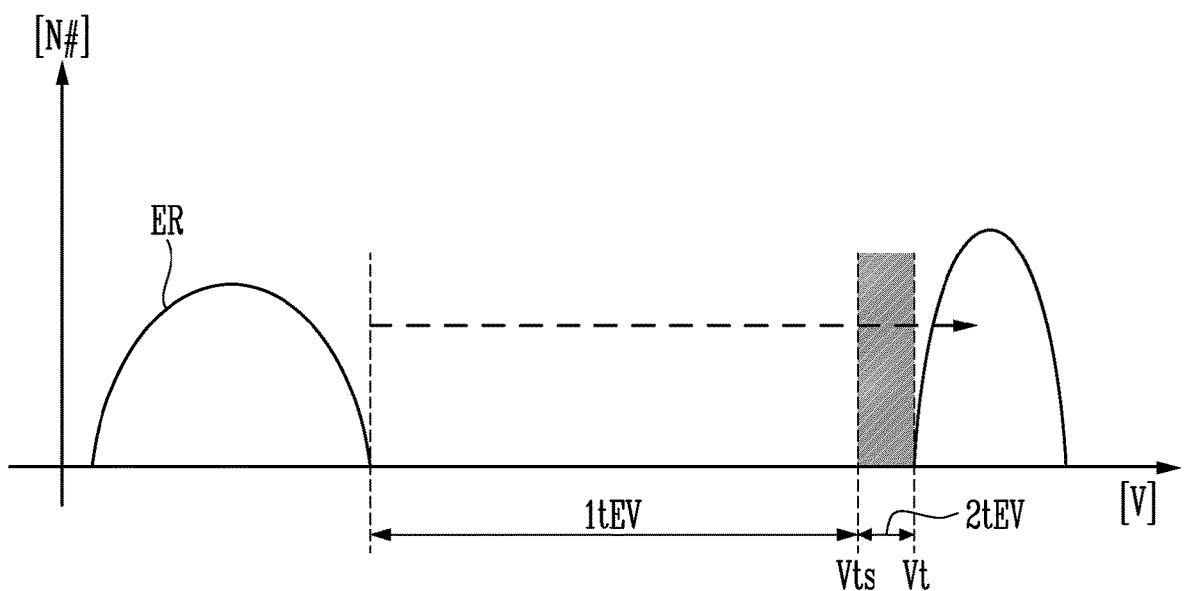
FIG. 18 is a diagram illustrating an embodiment of controlling a time in which an evaluation operation is performed according to threshold voltage of memory cells.

FIG. 18 is a diagram illustrating an embodiment of controlling the time of an evaluation operation according to a threshold voltage of memory cells.

Referring to FIG. 18, the evaluation time of the verify operation may be adjusted according to the threshold voltage of the slow memory cells. For example, at the beginning of programming the memory cells of the erase state ER, the verify operation to which the first evaluation time 1tEV is applied may be performed. When cells of which the threshold voltage is increased to the target voltage Vt are detected among the memory cells, two verify operations may be performed in one loop in the program operation of the cells of which the threshold voltage is not increased to the target voltage Vt. For example, a sub target voltage Vts lower than the target voltage Vt may be set. That is, after the verify operation for the sub target voltage Vts is performed, the verify operation for the target voltage Vt may be successively performed. From a loop in which the sub target voltage Vts is used, the verify operation to which the second evaluation time 2tEV is applied may be performed.

Figure 19:
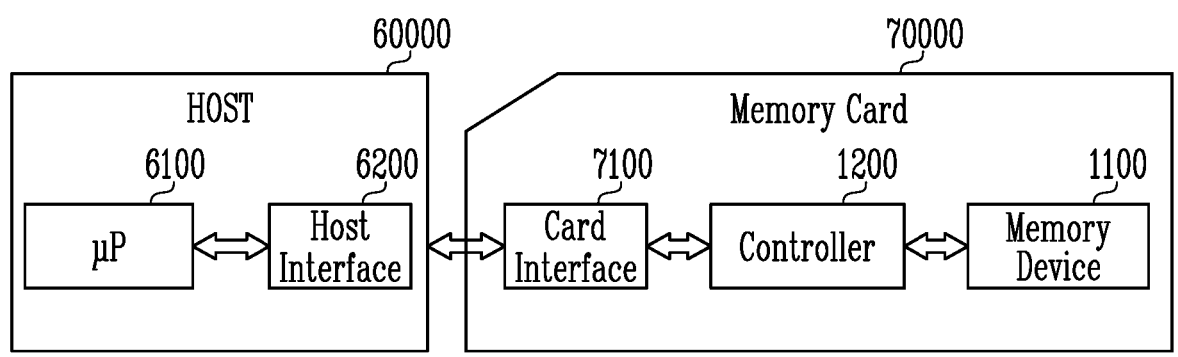
FIG. 19 is a diagram illustrating a memory system according to another embodiment of the present disclosure.

FIG. 19 is a diagram illustrating a memory system 70000 according to another embodiment of the present disclosure.

Referring to FIG. 19, the memory system 70000 may be implemented as a memory card or a smart card. The memory system 70000 may include the semiconductor memory device 1100, the controller 1200, and a card interface 7100.

The controller 1200 may control data exchange between the memory device 1100 and the card interface 7100. According to an embodiment, the card interface 7100 may be a secure digital (SD) card interface or a multi-media card (MMC) interface, but the invention is not limited thereto.

The memory device 1100 may perform a program operation according to the above-described embodiments, and data programmed in the memory device 1100 may be output through the card interface 7100 under control of the controller 1200.

The card interface 7100 may interface data exchange between a host 60000 and the controller 1200 according to a protocol of the host 60000. According to an embodiment, the card interface 7100 may support a universal serial bus (USB) protocol, and an inter chip (IC)-USB protocol. Here, the card interface 7100 may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the controller 1200 under control of a microprocessor (μP) 6100.

While the present invention has been illustrated and described in connection with various embodiments, those skilled in the art will recognize in light of the present disclosure that various modifications may be made to any of the disclosed embodiments within the spirit and scope of the invention. The present invention encompasses all such modifications that fall within the scope of the claims.

What is claimed is:

1. A memory device comprising:
   a memory block including a plurality of pages;
   a voltage generator configured to generate a program voltage or a verify voltage applied to a selected page among the plurality of pages;
   a page buffer connected to the selected page through bit lines and configured to perform a precharge operation, an evaluation operation, and a sensing operation on the bit lines during a verify operation; and
   a control circuit configured to store page addresses of slow pages of which a program operation speed for each is slower than an average program speed of the plurality of pages, and adjust an evaluation time of the evaluation operation according to the page addresses.

2. The memory device of claim 1, wherein the control circuit comprises:
   an address decoder configured to decode an address and output a row address and a column address;
   an address register configured to store the page addresses;
   a page buffer controller configured to output page buffer control signals for controlling the page buffer in response to a page buffer control code;
   a voltage generator controller configured to output an operation code for controlling the voltage generator in response to a voltage generator control code; and
   an operation controller configured to execute an algorithm for a program operation in response to a command, compare a page address in the row address with the page addresses stored in the address register, and output the page buffer control code and the voltage generator control code so that the evaluation time is adjusted according to a comparison result.

3. The memory device of claim 2, wherein the voltage generator sets a level of the verify voltage according to the operation code, and adjusts a time when the verify voltage is output.

4. The memory device of claim 2, wherein the page buffer controls the precharge operation, the evaluation operation, and the sensing operation according to the page buffer control signals.

5. The memory device of claim 4, wherein the page buffer precharges the bit lines to a positive voltage during the precharge operation, performs the evaluation operation during a first evaluation time or a second evaluation time shorter than the first evaluation time so that a threshold voltage of memory cells in the selected page is reflected on the bit lines, and performs the sensing operation of sensing a voltage or a current of a bit line on which the evaluation operation is performed and storing data corresponding to the sensing result in a latch.

6. The memory device of claim 5, wherein, when an address identical to a page address in the row address is not present among the page addresses stored in the address register, the operation controller outputs the page buffer control code and the voltage generator control code so that the evaluation operation is performed during the first evaluation time.

7. The memory device of claim 5, wherein, when an address identical to a page address in the row address is present among the page addresses stored in the address register, the operation controller outputs the page buffer control code and the voltage generator control code so that the evaluation operation is performed during the second evaluation time.

8. The memory device of claim 5, wherein the operation controller outputs the page buffer control code and the voltage generator control code so that the evaluation operation is performed during the second evaluation time and the evaluation operation is performed until a program operation of a slow page is completed.

9. The memory device of claim 5, wherein the operation controller outputs the page buffer control code and the voltage generator control code so that the evaluation operation is performed during the first evaluation time being from a start of a program operation of a slow page to a reference time point, and outputs the page buffer control code and the voltage generator control code so that the evaluation operation is performed during the second evaluation time being from the reference time point to an end of the program operation.

10. A method of operating a memory device, the method comprising:
    classifying each of a plurality of pages as a fast page or a slow page according to a program operation speed; and
    performing a verify operation for a program operation such that an evaluation operation is performed during a first evaluation time when a selected page is the fast page, and performing the verify operation such that the evaluation operation is performed during a second evaluation time shorter than the first evaluation time when the selected page is the slow page,
    wherein the program operation ends when the verify operation has passed, and classifying and performing are repeated until the verify operation passes when the verify operation has failed.

11. The method of claim 10, wherein the classifying of each of the plurality of pages as the fast page or the slow page comprises:
    performing a test program operation on the plurality of pages;
    classifying a page of which a program speed is slower than a reference speed as the slow page, and classifying a page of which the program speed is faster than the reference speed as the fast page, as a result of the test program operation; and
    storing a page address of each of the slow pages in an address register.

12. The method of claim 11, wherein the performing of the verify operation comprises:
    precharging bit lines connected to the selected page among the plurality of pages to a positive voltage;

applying a verify voltage to a word line connected to the selected page, and performing the evaluation operation during the first or second evaluation time; and performing a sensing operation of sensing data according to a voltage or a current of the bit lines and storing the sensed data in latches.

13. The method of claim 12, wherein, when the verify operation of all memory cells in the selected page has passed, the program operation ends, and when cells of which the verify operation has not passed are present among memory cells in the selected page, it is determined that the verify operation has failed.

14. A method of operating a memory device, the method comprising:

classifying each of a plurality of pages as a fast page or a slow page according to a program operation speed; and performing a verify operation for a program operation such that an evaluation operation is performed during a first evaluation time when a selected page is the fast page, performing the verify operation such that the evaluation operation is performed based on the first evaluation time when the selected page is the slow page, and performing the verify operation such that the evaluation operation is performed during a second evaluation time shorter than the first evaluation time when a reference time point is reached during a program operation of the slow page, wherein the program operation ends when the verify operation has passed, and classifying and performing are repeated until the verify operation passes when the verify operation has failed.

15. The method of claim 14, wherein the classifying of each of the plurality of pages into the fast page or the slow page comprises:

performing a test program operation on the plurality of pages;

classifying a page of which a program speed is slower than a reference speed as the slow page, and classifying a page of which the program speed is faster than the reference speed as the fast page, as a result of the test program operation; and storing a page address of each of the slow pages in an address register.

16. The method of claim 15, wherein the performing of the verify operation of the slow page comprises:

precharging bit lines connected to the selected page among the plurality of pages to a positive voltage;

applying a verify voltage to a word line connected to the selected page, performing the evaluation operation during the first evaluation time from a start of the program operation to the reference time point, and performing the evaluation operation during the second evaluation time after the reference time point; and performing a sensing operation of sensing data according to a voltage or a current of the bit lines and storing the sensed data in latches.

17. The method of claim 14, wherein the reference time point is set according to the number of program pulses applied to the slow page.

18. The method of claim 14, wherein the reference time point is set to a time point at which cells of which a threshold voltage is increased to a target voltage among memory cells in the slow page are detected.

19. The method of claim 18, further comprising:

when the cells of which the threshold voltage is increased to the target voltage are detected, performing a verify operation using a sub target voltage lower than the target voltage before performing a verify operation using the target voltage of a next loop.

\* \* \* \* \*